United States Patent [19]

Burns et al.

[11] Patent Number: 4,523,314
[45] Date of Patent: Jun. 11, 1985

[54] READ ERROR OCCURRENCE DETECTOR FOR ERROR CHECKING AND CORRECTING SYSTEM

[75] Inventors: Gary D. Burns, Cottage Grove; Scott D. Schaber, St. Paul, both of Minn.

[73] Assignee: Sperry Corporation, New York, N.Y.

[21] Appl. No.: 464,184

[22] Filed: Feb. 7, 1983

[51] Int. Cl.³ .............................................. G06F 11/10
[52] U.S. Cl. .................................................... 371/38
[58] Field of Search ............................ 371/38, 37, 41

[56] References Cited

U.S. PATENT DOCUMENTS

| | | | |
|---|---|---|---|
| 3,755,779 | 8/1973 | Price | 371/38 |
| 3,825,893 | 7/1974 | Bossen et al. | 371/38 |
| 4,319,357 | 3/1982 | Bossen | 371/38 |
| 4,334,309 | 6/1982 | Bannon et al. | 371/38 |
| 4,345,328 | 8/1982 | White | 371/38 |
| 4,375,664 | 3/1983 | Kim | 371/38 X |
| 4,417,339 | 11/1983 | Cantarella | 371/37 |

OTHER PUBLICATIONS

Stojko et al., Error-Correction Code, IBM Technical Disclosure Bulletin, 3/68, vol. 10, No. 10, p. 1437.

*Primary Examiner*—Jerry Smith
*Assistant Examiner*—Mark Ungerman
*Attorney, Agent, or Firm*—Charles A. Johnson; Kenneth T. Grace; Marshall M. Truex

[57] ABSTRACT

An improved error indicating system utilizing adder circuits for use with an error correction code system capable of detecting and indicating multiple bit errors and detecting and correcting single bit errors is described. The system utilizes an encoding system for generating a plurality of check bits, each check bit associated with a predetermined bit grouping of data bits within a data word. When a data word is accessed, read check bits are reconstituted from the read data and are compared to the check bits originally encoded. Syndrome bits are generated from the originally encoded check bits and the reconstituted read check bits, the syndrome bits thus generated, serving to identify whether the data word accessed contains no errors, a single bit error, or a multiple bit error. Decoder circuitry for decoding the syndrome bits and effecting the control signals for controlling the correction of single bit errors is described. The syndrome bits are applied to the adder circuits in predetermined groupings, and the carry signals from each of the adder circuits are applied to circuitry for detecting the occurrence of multiple bit errors. Selected ones of the decoded syndrome bits are utilized to determine the occurrence of single bit errors.

13 Claims, 6 Drawing Figures

FIG. 2

| | DATA BITS | | | | | | | | | | | | | | | | | | | | | | | | | | | | | | | | | | | | CHECK BITS | | | | | |
|---|---|---|---|---|---|---|---|---|---|---|---|---|---|---|---|---|---|---|---|---|---|---|---|---|---|---|---|---|---|---|---|---|---|---|---|---|---|---|---|---|---|---|
| | 1 | 3 | 5 | 7 | 9 | 11 | 13 | 15 | 17 | 19 | 21 | 23 | 25 | 27 | 29 | 31 | 33 | 35 | | | | | | | | | | | | | | | | | | | C1 | C3 | C5 | | | |
| 0 | 2 | 4 | 6 | 8 | 10 | 12 | 14 | 16 | 18 | 20 | 22 | 24 | 26 | 28 | 30 | 32 | 34 | | | | | | | | | | | | | | | | | | | | C0 | C2 | C4 | CT | | |
| x | | x | | x | | x | | x | | x | | x | | x | | x | | x | | | | | | | | | | | | | | | | | | x | | | | | |
| | x | x | | | x | x | | | x | x | | | x | x | | | x | x | | | | | | | | | | | | | | | | | | | x | | | | |
| | | | x | x | x | x | | | | | x | x | x | x | | | | | | | | | | | | | | | | | | | | | | | | x | | | |
| | | | | | | | x | x | x | x | x | x | x | x | | | | | | | | | | | | | | | | | | | | | | | | | x | | |
| | | | | | | | | | | | | | | | x | x | x | x | x | x | x | x | x | x | x | x | | | | | | | | | | | | | | x | |
| x x x x x x x x x x x x x x x x x x x x x x x x x x x x x x x x x x x x | | | | | | | | | | | | | | | | | | | | | | | | | | | | | | | | | | | | | | | | | | x |
| | | | | | | | | | | | | | | | | | | | | | | | | | | | | | | | | | | | | | | | | | TOTAL PARITY x |

FIG. 3

| S6 S5 S4 S3 | | | | | | | | | |
|---|---|---|---|---|---|---|---|---|---|
| | 0 0 0 0 | 0 0 0 1 | 0 0 1 0 | 0 0 1 1 | 0 1 0 0 | 0 1 0 1 | 0 1 1 0 | 0 1 1 1 | S2 S1 S0 |
| 0 0 0 | NE | C0 | C1 | M | C2 | M | M | M ~194 | |
| 0 0 1 | C3 | M | M | M | M | 0 | 1 | 2 3 | |
| 0 1 0 | C4 | M | M | M | M | 4 5 6 7 | 8 9 10 11 | M M M M | |
| 0 1 1 | C5 | M | M | M | M | 12 13 14 15 | 16 17 18 19 | M M M M ~200 | |
| 1 0 0 | | | | | | 20 21 22 23 | 24 25 26 27 | | |
| 1 0 1 | | | | | | 28 29 30 31 | 32 33 34 35 | | |
| 1 1 0 | | | | | | | | | |
| 1 1 1 | | | | | | | | | |

LEGEND

NE = NO ERROR
M = MULTIPLE BIT ERROR
Ci = CHECK BIT-SINGLE BIT ERROR

| ERROR TYPE | S6 | S5-S0 |
|---|---|---|
| NO ERROR | 0 | 000000 |
| UNCORRECTABLE | 0 | ANY NON-ZERO |
| UNCORRECTABLE | 1 OR 0 | UNDEFINED (M) |
| SINGLE BIT S6 | 1 | 000000 |
| SINGLE BIT DATA | 1 | Ci OR BIT NO. |

READ ERROR OCCURRENCE DETECTOR FOR ERROR CHECKING AND CORRECTING SYSTEM

BACKGROUND OF THE INVENTION

1. Field of the Invention

The present invention relates to an improvement of data processing systems employing memory systems that utilize error checking and correcting systems. More particularly, it relates to systems for detecting the occurrence of data errors.

2. State of the Prior Art

One of the basic reasons for the rapid advancement of data processing has been the ongoing development of improved memory devices. Improvements of memory devices have included improvement of memory cells that are ever-reducing in size, while ever-increasing in the rate of performance. The reductions in size have been occasioned by manufacturing techniques. Particularly, integrated circuit manufacturing techniques have led to large capacity memories physically located in very compact structures.

While early data processing systems simply stored data either on fixed medium such as punched cards or punched paper tape, or in addressable storage, it was soon established that it was desirable to recognize the occurrence of errors within fixed groupings of data signals. In digital data processing systems operating on data words comprised of predetermined bit groupings, it became common to utilized an additional bit for parity determination. The use of parity systems allows the detection of errors but not the correction thereof.

Parity as an error detecting mechanism is known, and in binary systems requires only a single additional bit position for the bit groupings to be checked. The parity bit is then utilized to establish either an odd or even count of the ones or zeros in the bit grouping to be checked. It is, of course, apparent that multiple errors can be offsetting, and thereby defeat the parity check. Offsetting errors may allow erroneous data to be processed.

Data communication systems have been found to be particularly susceptible to occurrence of errors. Parity systems have been developed for data communication wherein the bit groupings are broken into subsets with a parity bit added for each subset for transmission. These additional parity bits render the likelihood of detecting errors more probable, but at the expense of the overhead of the additional bits having to be transmitted. In communication systems it was also early determined to be advantageous to be able to correct certain detected errors. Such systems normally included the coding of the data bits in predetermined formats with redundant check patterns such that multiple errors could be detected and corrected. Such encoding and decoding led to more reliable communication systems and allowed for the system to maintain its operable status in the face of certain types of intermittent failures.

Memory systems have increased in storage capacity and rate of operation, and the reliable operation of memory systems is basic to maintaining the integrity of data processing systems.

A technique was proposed for coding data permitting correction of single bit errors and detection of double bit errors, by R. W. Hamming in an article entitled "Error Detecting And Error Correcting Codes" in the Bell System Technical Journal, Volume 29, Pages 147 through 160 published April, 1950. Many memory systems have built upon this type of Error Correction Codes, hereinafter referred to as ECC. For example, U.S. Pat. No. 3,755,779, issued to Donald Walter Price sets forth a system for detecting and correcting single errors and includes apparatus for detecting unrelated double errors. Further examples of coding systems for providing single-bit error correction and double-bit error detection are described in U.S. Pat. No. 4,345,328 to Gary D. White; U.S. Pat. No. 4,077,028 to Albert S. Lui and Majid Arbab; U.S. Pat. No. 4,319,356 to James E. Kocol and David B. Schuck; U.S. Pat. No. 4,077,565 to Chester M. Nibby, Jr. and George J. Barlow; and U.S. Pat. No. 4,319,357 to Douglas C. Bossen.

The foregoing identified patents describe various types of systems that can code data bits with redundant check bits in various configurations, with the check bits being recorded in the memory system with the data bits. When the data bits are to be accessed, systems are described for reconstituting check bits from the data bits read, and thereafter performing a comparison to the check bits that were originally recorded. Syndrome bits are generated as a result of comparison of the reconstituted check bits to the check bits read from memory. The syndrome bits are decoded and a determination made as to which, if any, error bits are detected. Various types of circuitry are described for effecting the corrections that can be accommodated in the system. Many of the systems illustrated also describe error indicator circuitry for indicating the type of errors that were detected. It is to this latter feature that the subject invention is directed. The error indicator circuits in the prior art, as will be described in more detail below, characteristically translate the syndrome bits for providing indications as to the nature of the errors detected. Since this error indicating function occurs each time there is a memory read, it is desirable that the error indicator circuitry operate as fast as possible, that it minimize the number of circuits required to accomplish the error indication function, and that it minimize the loading of the circuitry that generates the syndrome bits.

In addition to the error detection and correction functions, it has developed that through-checking is desirable for detecting and isolating errors that occur as data is transferred through the system. Through-checking ECC systems for use with memory devices are described in U.S. patent application Ser. No. 354,340 entitled "Memory Through Checking System" by James H. Scheuneman, assigned to the assignee of the present invention and U.S. patent application Ser. No. 354,328 entitled "Error Correction Code Through Check System" by John R. Trost, also assigned to the assignee of the present invention.

OBJECTS

It is a primary object of this invention to provide an improved memory system with error detection and correction capabilities together with an improved error indicating system.

Another primary object of this invention is to provide an improved error indicating system for use in conjunction with the error detection and correction circuitry associated with a memory system.

Yet a further object of the invention is to replace the complex translator circuit array for providing error indication in prior art error correction code systems with a simplified error indicating circuit utilizing adders.

It is a further object of the invention to reduce the circuit loading for the circuits generating syndrome bits in an error correction code system through the use of adders in the error indicating circuitry, thereby improving the speed of operation of error detection.

Still a further object of the invention is to provide an improved error indicating circuit utilizing adder circuits wherein an error correction code system for detecting and correcting read errors in a memory system can be implemented in a single very large scale integration (VLSI) chip rather than in two or more gate array chips required in the prior art.

SUMMARY OF THE INVENTION

With the foregoing in mind, the present invention provides an improved memory accessing system utilizing error correction code circuitry for detecting and correcting errors when data words are accessed, and incorporating improved error indicating circuitry. The memory system is arranged for storing data words comprised of a plurality of binary bits at addressable locations. The error correction code system utilized with the memory system provides for the storage of check bits associated with each of the addressable words, where the check bits are generated according to a predetermined system at the time the data words are recorded. When data words are addressed and read out of the memory device, read check bits are generated from the data bits, the generation being in the same manner as that provided when the data words were originally checked. The read data check bits are compared to the check bits read from the memory device when the data word is addressed. These two sets of check bits are applied to syndrome bit generating circuitry for generating syndrome bits indicative of the relationship of the read data check bits to the check bits originally recorded. The syndrome bits are evaluated by error indicating circuitry, after decoding, to provide signals indicative of the type of error, if any, and to cause correction where possible. The error indicating circuitry utilizes a set of adder circuits to analyze the syndrome bits for providing an indication of a single bit error or multiple error when errors occur.

The foregoing and other more detailed specific objectives of the invention, and the detailed functioning of the invention will be described and shown in the drawings, described in detail below.

BRIEF DESCRIPTION OF THE DRAWINGS

FIG. 2 illustrates one type of check bit generation system wherein an example 36-bit data word is utilized in conjunction with seven check bits.

FIG. 3 is a Syndrome Map and illustrates the identification of detected malfunctions occurring during reading of data words.

DESCRIPTION OF THE PREFERRED EMBODIMENT

Figure 1:
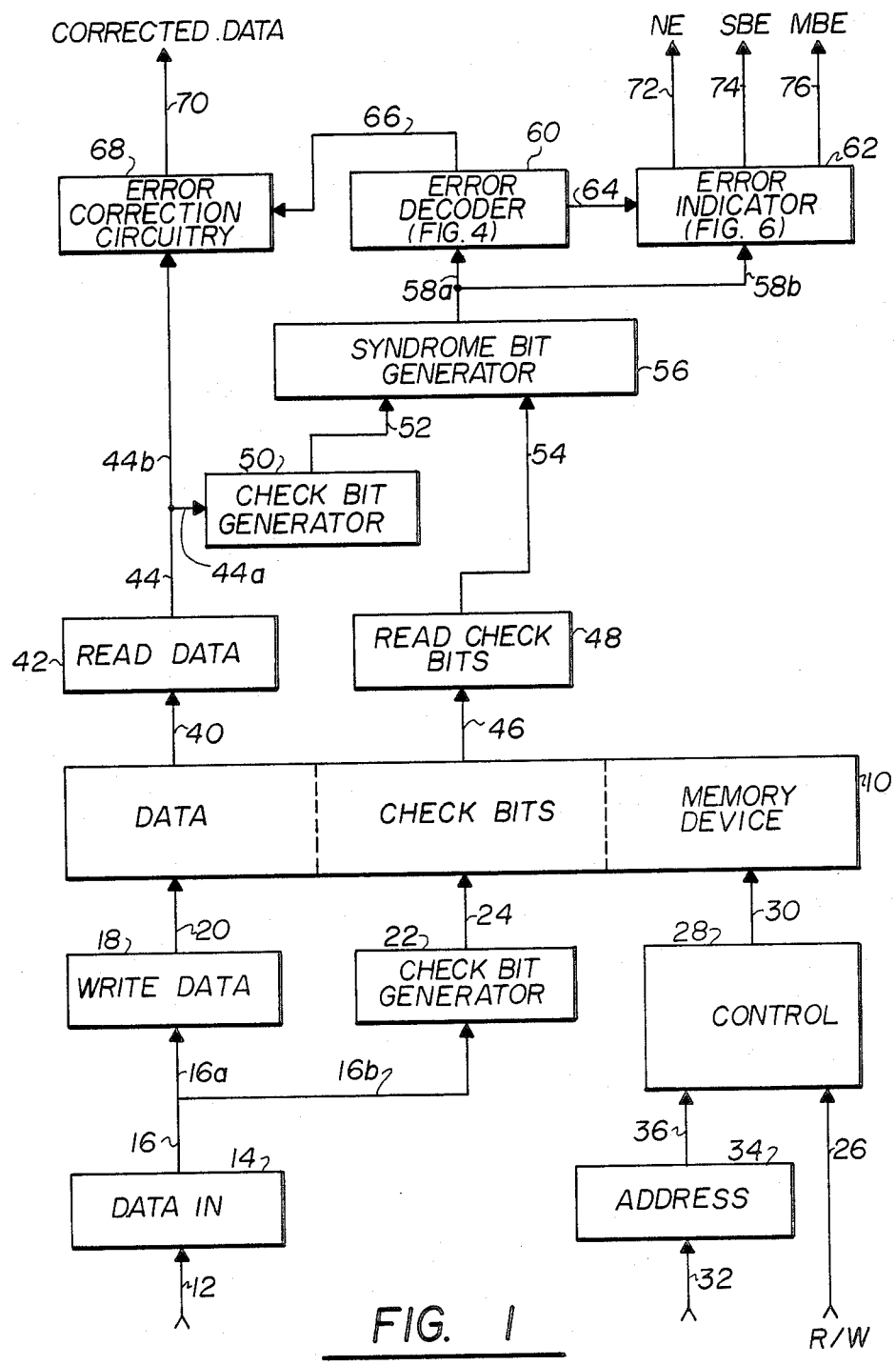
FIG. 1 is a block diagram and illustrates the improved memory accessing system having an improved error indicating circuit arrangement for use as part of the error correction code system.

FIG. 1 is a block diagram that illustrates the improved memory accessing system having an improved error indicating circuit arrangement for the use as part of the error correction code system.

While the error indicating circuit arrangement can find use in other systems, the subject invention will be described in operation as part of a digital data processing system. A data processing system utilizes a data processing unit (not shown) for performing programmed manipulation of data words. Accordingly, the data processing system also requires the facility for storing data words and instruction words, and accessing data words and instruction words thus stored. The memory system of FIG. 1 includes a Memory Device 10, of a type available in the prior art, and capable of accessing a plurality of data bits together with a grouping of check bits associated therewith. Individually accessed groupings of data bits are referred to as data words. It is understood that the invention can be utilized with a read only memory (ROM), but will functionally be described as used with a random access memory (RAM). The primary functional distinction between the ROM and the RAM is that the bit configurations in the addressable locations are fixed in the ROM, whereas they are alterable in the RAM. Both types of memory devices can provide for the arbitrarily defined access to addressable locations for readout.

The memory system is arranged for receiving data signals on line 12 from a source (not shown), where it is assembled in the appropriate format in the Data In circuitry 14. Depending upon the type of memory system, the data bits received on line 12 can be received serially, in parallel by addressable word, in parallel by a subset such as a byte of an addressable word, and can be accompanied by through-checking parity bits. It is the function of the Data In circuitry 14 to accommodate the protocol of the transmission, and assemble data words for recording in the Memory Device 10. Characteristically, the data words to be recorded are provided with the bits in parallel on line 16. For example, if a 36-bit data word is to be recorded, there would be 36 conductive paths in line 16, plus the number of conductors required for through-checking parity, if any. Data words to be recorded are provided on line 16a to the Write Data circuitry 18, which function to provide drive signals on line 20 for activating the drive circuits in the Memory Device 10.

At the same time, the data words are provided on line 16b to the Check Bit Generator 22 where check bits are generated and provided for recording on line 24 to the Check Bit portion of the Memory Device 10. The check bits are individually generated for predetermined bit groupings within the data word, as will be described further below, each check bit being a parity bit for its associated bit grouping. The Check Bit Generator 22 can be a set of parity generators, each responsive to the predetermined bit grouping of the applied data words. The parity function is basically generated by forming the Exclusive OR of all of the predetermined bits for the particular check bit.

In order to control the reading or writing function of Memory Device 10, a read or write selection R/W is received on line 26. This function selection is applied to the Control circuitry 28, which functions to control the operation of the Memory Device 10 through signals provided on line 30.

In order to determine the addressable location at which writing will occur or from which reading will be made, a memory address is received on line 32, is applied to the Address circuitry 34, and the resultant signals to control addressing are provided on line 36 to Control 28. The control 28 provides timing, and such other control signals as are necessary to control the reading and writing in the particular type of Memory Device 10 utilized. All of these circuits and functions are known and available generally in the prior art.

When data words have been recorded in the Memory Device 10, and it is determined that it is desirable to access and read out any selected one of such data words, a read signal is received on line 26 with the specified address received on line 32. The Control 28 causes the Memory Device to provide the specified read data signals on line 40, which are made available by the Read Data circuitry 42 on line 44. At the same time, the addressed check bits for the associated addressed data words are provided on line 46 to the Read Check Bits circuitry 48. The read data bits are provided on line 44a to the Check Bit Generator circuitry 50, which functions to generate check bits from the read data in precisely the same format and manner as that performed by Check Bits Generator 22 when the data words are recorded. It can be seen, then, that if the data word and its associated bits are properly recorded and read back, that the reconstituted check bits provided on line 52 will coincide exactly with the check bits provided on line 54, as read from the Memory Device 10. Any difference in the check bit pattern will indicate that an error has occurred. The precise combinational differences will define the nature of the error or errors and whether or not the detected error condition is correctable.

The Syndrome Bit Generator 56 is responsively coupled to receive the check bits read from Memory Device on line 54 and the check bits that are reconstituted from the read data provided by Check Bit Generator 50 on line 52. The Syndrome bits are generated by performing the Exclusive OR function of the reconstituted read check bits with associated ones of the check bits read from the Memory Device. For the illustrative embodiment shown, there are six syndrome bits S0 through S5 thus generated. The seventh, or total syndrome bit, identified as S6, is formed by performing the Exclusive OR function of all of the data bits and check bits as read from Memory Device 10. The generation of syndrome bits has been described in the prior art, and need not be described in further detail.

The syndrome bits are applied on line 58a to Error Decoder 60 and on line 58b to the Error Indicator circuitry 62. The Error Decoder circuitry provides control signals on line 64 to Error Indicator circuitry 62 of the present invention. The Error Decoder circuitry provides signals on line 66 to correct correctable errors in the read data received on line 44b and provide corrected data out on line 70. The Error Indicator circuitry 62 provides a signal on line 72 when no error NE is detected, on line 74 when a single bit error SBE is detected, and line 76 when a multiple bit error MBE is detected. It is to the improved circuit arrangement of Error Indicator circuitry 62 in the memory system that the subject invention is directed.

FIG. 2 illustrates one type of check bit generation system wherein an example 36-bit data word is utilized in conjunction with seven check bits. The check bits C0 through CT are each generated by parity generating circuitry of a type available in the prior art, from the data bit positions indicated. This parity generation circuitry is essentially the formation of the Exclusive OR of the predetermined bit groupings illustrated. This type of generation of check bits has been described and is known in the prior art, and will not be described in detail. Suffice it to say that the Check Bit Generator 22 provides check bits for recording in the Memory Device 10 from the data words received, and the Check Bit Generator 50 provides an identical function for generating reconstituted check bits from the data read from the Memory Device.

FIG. 3 is a Syndrome Map and illustrates the identification of detected malfunctions occurring during reading of data words. The syndrome bits are identified at S0 through S6, with S0 through S5 being the six syndrome bits generated from the comparison of check bits C0 through C5 for the check bits read from the Memory Device and reconstituted check bits resulting from the read data. Syndrome bit S6 is the syndrome bit generated from all of the read data bits and all of the check bits. In order to simplify the Syndrome Map as it relates to S6, the Legend describes the various detected conditions dependent upon the value of S6 in combination with other syndrome bits. When all syndrome bits S0 through S6 are zero, it signifies No Error has occurred. An uncorrectable condition occurs when S6 is zero and any of S0 through S5 are nonzero. A multiple bit error condition, that is an uncorrectable condition, occurs when S6 is either one or zero and the combination of syndrome bits S0 through S5 results in an undefined M condition. When S6 is one and all other syndrome bits S0 through S5 are zero, it signifies a single bit error in the S6 location. When S6 is one, and any check bit or data bit number is one, as indicated by the appropriate combination of syndrome bits S0 through S5, a single bit data error SBE has been detected and can be corrected. The dashed block grouping of elements within the Syndrome Map will be discussed with relation to particular circuits below.

Figure 4:
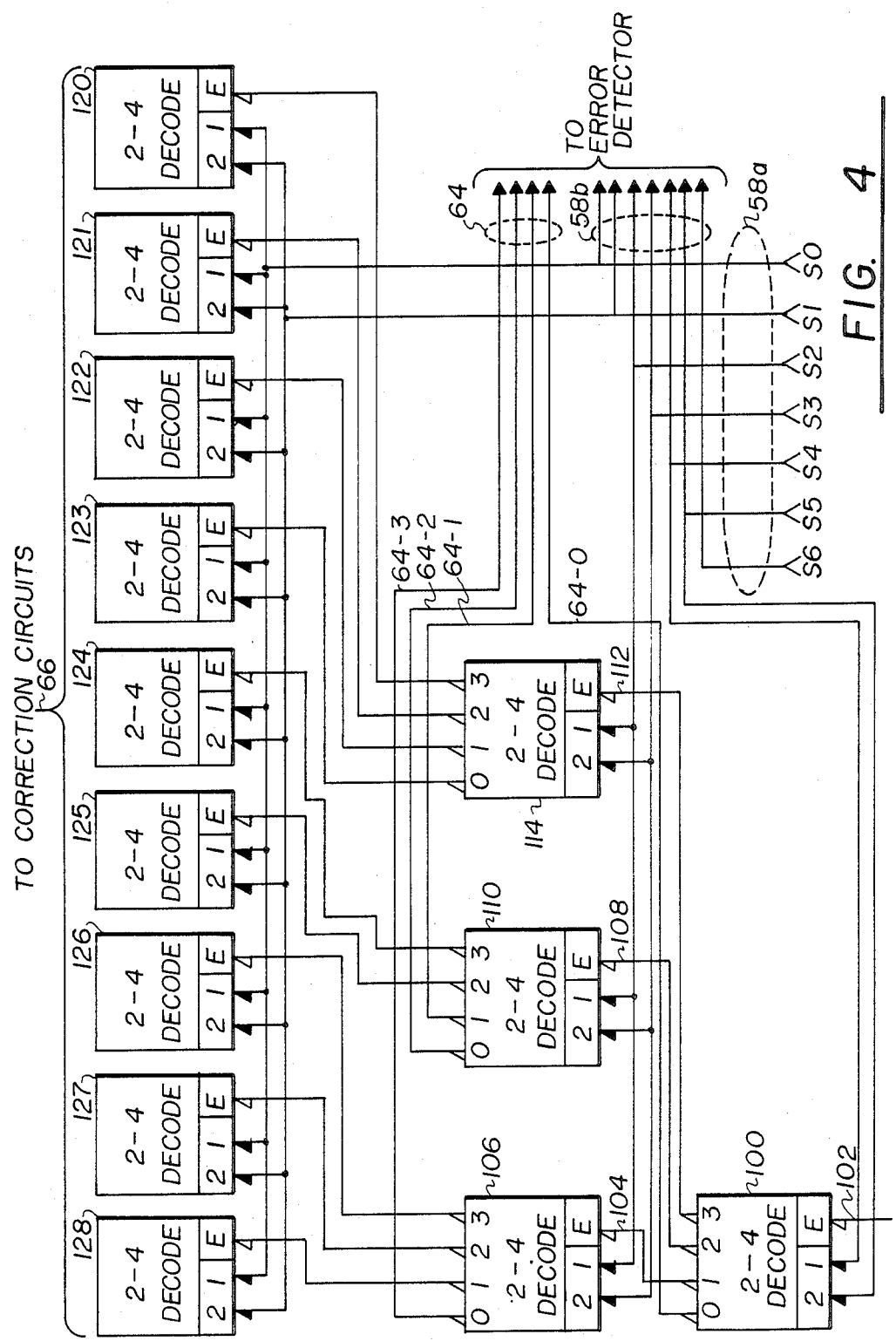
FIG. 4 is a logic block diagram of the array of decode circuits for selecting the error bit for correction in response to the syndrome bits.

FIG. 4 is a logic block diagram of the array of decode circuits for selecting the error bit for correction in response to the syndrome bits. The circuitry is that identified as Error Decoder 60 in FIG. 1. The Error Decoder is comprised of a plurality of 2-4 Decode circuits. Each of the 2-4 decode circuits, which can be selected from circuits available commercially, provides an active output on one of four available output terminals dependent upon the count applied the input terminals when enabled. The closed arrow indicates a high signal or a logical one, while an open arrow indicates a low signal or a logical zero. The input signals can be considered as a count, with only one of the output terminals going low depending upon the input count. For example, if neither S4 or S5 is high, 2-4 Decode circuit 100 will provide a low signal at its zero output to line 64-0. The translation occurs upon an enable signal on line 102 received from Control 28. If S4 is low and S5 is high, a signal will be provided on line 104 to enable Decode circuit 106. When S4 is high and S5 is low, a signal will be provided on line 108 to enable Decode circuit 110. Finally, when both S4 and S5 are high, a signal will be provided on line 112 to enable Decode circuit 114. Syndrome bits S2 and S3 are applied to circuits 106, 110 and 114, and depending upon which of these circuits is enabled by Decode circuit 100, will provide translation on the appropriate output lines. One function of Decode circuits 106, 110 and 114 is to provide a selective enable of one and only one of the nine output 2-4 Decode circuit 120 through 128. Depending upon the combination of enables and S2 and S3, these Decode circuits 106, 110 and 114 will selectively provide signals on lines 64-1, 64-2 and 64-3 for use with the Error Indicator circuitry 62 which will be described in detail with regard to FIG. 6. The rank of Decode circuits 120 through 128 is responsively coupled to syndrome bits S0 and S1 and provide the final translation for a selection of 1-of-36 output lines to line 66 which will identify the bit position in the read data word to be corrected. If there is a multiple bit error, the output line 66 will not identify a correction condition that can be utilized, and the Error Correction circuitry 68 will not be allowed to function to correct any bit positions. It is not deemed necessary to trace each of the syndrome bit combinations through the Error Decoder circuitry 60, since the functioning is apparent from a consideration of the Syndrome Map of FIG. 3.

Figure 5:
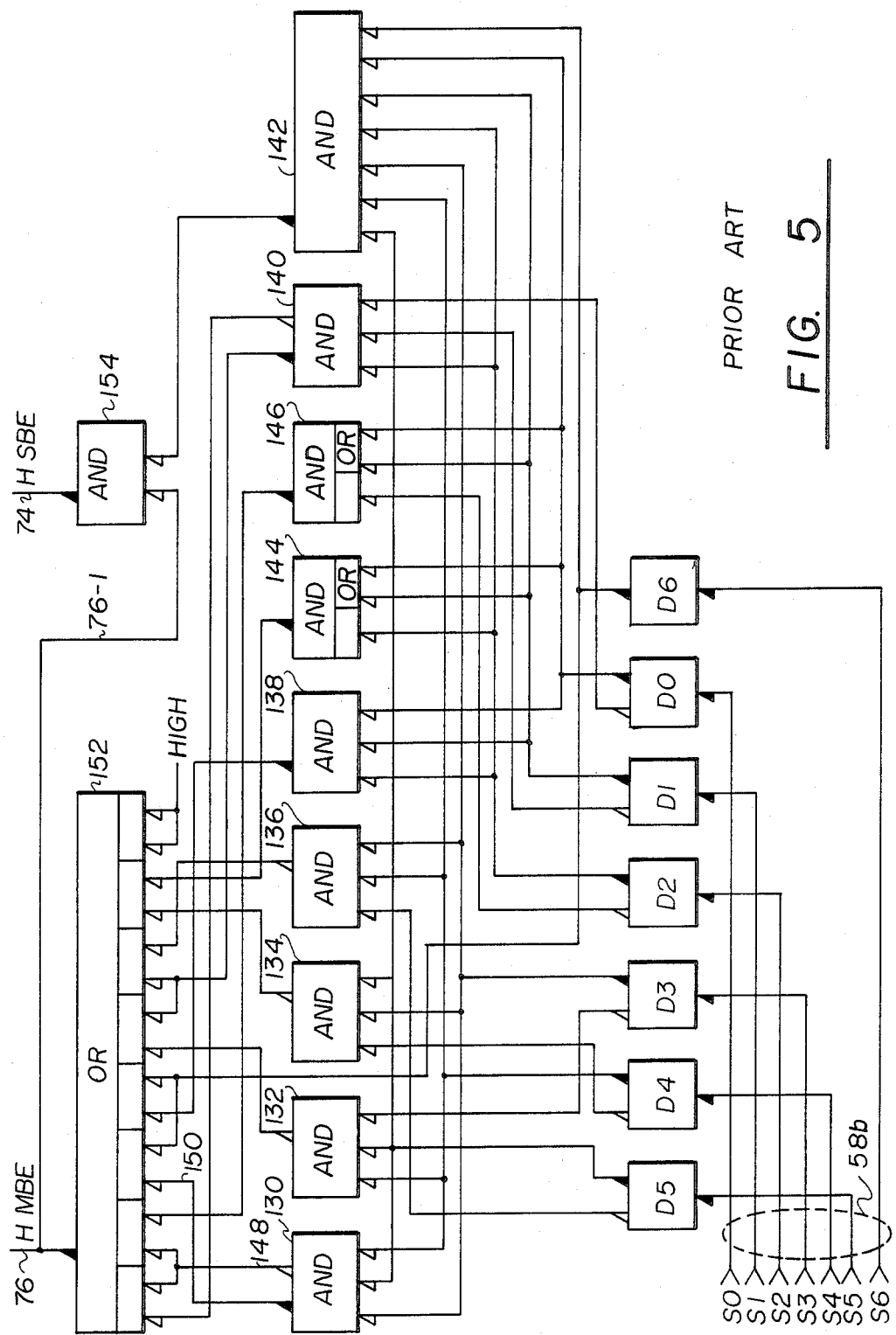
FIG. 5 is a logic block diagram of an illustrative prior art array decoder for providing an indication of the type of error that has occurred in response to the syndrome bits.

FIG. 5 is a logic block diagram of an illustrative prior art array decoder for providing an indication of the type of error that has occurred in response to the syndrome bits. In the prior art, circuitry similar to FIG. 5 would be Error Indicator circuitry 62 of FIG. 1. It can be seen that the syndrome bits S0 through S6 are applied on line 58b as the input signal to the prior art Error Indicator. These signals are applied to drivers D0 through D6, which are utilized in the true and complement value of each of the syndrome bits with the exception of S6 where only the true value is utilized. The output signals from drivers D0 through D6 are applied to an array of logic circuits comprised of AND circuits 130, 132, 134, 136, 138, 140 and 142 as well as AND/OR circuits 144 and 146. All of these circuits are circuits that are available commercially and provide the logical functions indicated, together with providing the true and complement output signals resulting from the logical function indicated. For example, AND 130 may be considered to be a low AND with a low signal provided on line 148 and a high signal provided on line 150 when all input signals are low. A high on any or all input signals would reverse the signals on lines 148 and 150. The combinational output signals from this array of logic circuits is applied to AND/OR circuit 152, the output of which provides a high signal on line 76 when a multiple bit error MBE is detected. When line 76 is low, a signal on line 76-1 to AND circuit 154 will be combined with the output of AND circuit 142 for determining when a single bit error SBE signal should be applied on line 74. It is not deemed necessary to trace each and every combination of syndrome bits through the logic array, since the combinational arrangement can be readily discerned from the logic illustrated. It can be seen that the prior art array-type Error Indicator utilizes a great many logic elements, requires substantial loading on the syndrome bit lines, and consequently slows the overall operation of the error indicating function.

Figure 6:
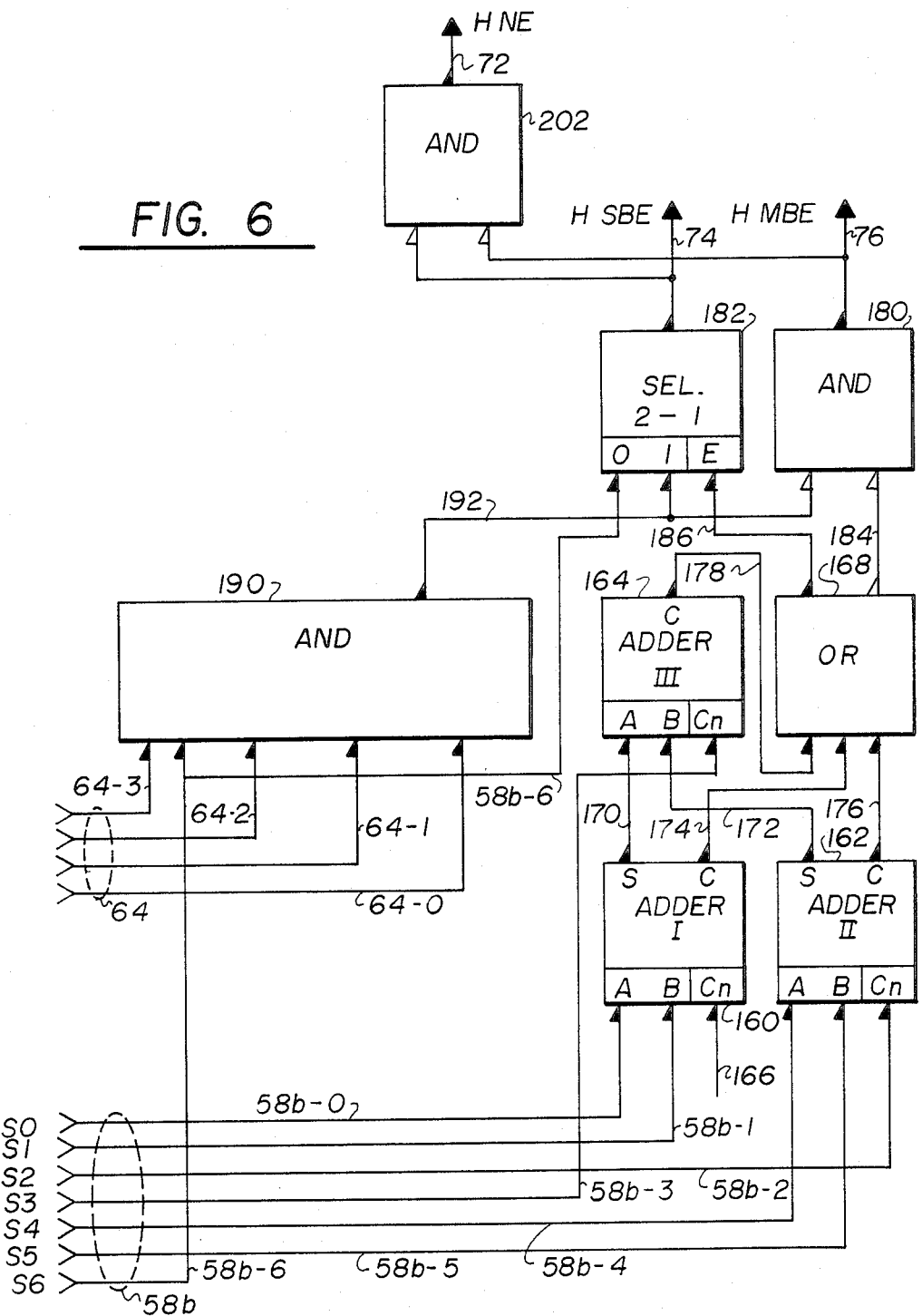
FIG. 6 is a logic block diagram of the improved read error occurrence detector of the present invention.

FIG. 6 is a logic block diagram of the improved read error occurrence detector of the present invention. This circuitry is the inventive Error Indicator 62 of FIG. 1, and replaces the prior art array decoder just described with regard to FIG. 5. In addition to the syndrome bits received on line 58b (see FIG. 4) the circuitry utilizes the signals provided on line 64. The Error Indicator 62 utilizes adder means comprised of Adder I, labeled 160, Adder II, labeled 162, Adder III, labeled 164, for purposes of interpreting the relationships of syndrome bits S0 through S5. These Adder circuits provide the sum S and carry C in response to input signals applied to terminals A and B, together with the signal applied to the carry input Cn. Full adder circuits of this type are available commercially. Functionally, when the carry input Cn has a low signal applied, the output sum S will be low or zero when both input signals to input terminal A and B are high. Under these conditions, the carry output terminal C will be high. If either or both input signals applied to terminals A and B are low, the carry output signal will be low indicating the absence of a carry condition. The sum S output will be one or high, when either of the input signals to A and B are high, and will be low when neither of the input signals to A and B are high.

When the input carry Cn is high, the occurrence of a high input signal on either or both input terminals A and B will result in an output carry C being high. The state of the sum S output will be established as high if both input signals to input terminals A and B are either low or high. The sum S output will be low if either, but not both, input signals to terminals A and B are high.

Considering the specific circuit arrangement, then, the input carry Cn of Adder I received on line 166 is coupled to a low source, thereby indicating that there is the equivalent of no input carry to the circuit. Syndrome bits S0 and S1 are fed to the input terminals A and B via lines 58b-0 and 58b-1, respectively. The input signals to Adder II are derived from syndrome bit S2, which is directed to the Cn terminal on line 58b-2, in combination syndrome bits S4 and S5 which are directed to A and B input terminals via lines 58b-4 and 58b-5, respectively. Adder III receives the input carry signal to its input terminal Cn from syndrome bit S3 on line 58b-3.

The combination of functions of Adder circuits 160, 162 and 164 is to determine when more than one syndrome bit has been set. This is accomplished by directing all Carry output signals to high OR circuit 168. The interconnection of Adder circuits is accomplished by directing the sum S output of Adder I via line 170 to A input of Adder III, together with the sum S output of Adder II to its B input via line 172. The carry C output terminals are coupled to high OR circuit 168 via lines 174, 176 and 178.

The final selection of single bit error or multiple bit error is accomplished by low AND circuit 180 and 2-1 Sel. 182. The complement output terminal of high OR 168 is provided as one input on line 184 to low AND 180. The other input signal will be described below. The true output signal from high OR 168 is provded on line 186 to the enable E input terminal of the 2-1 Sel. Circuit 182.

Functionally, then, it will be seen that high OR 168 will be active when a carry occurs from any one or more of the Adder circuit 160, 162 and 164. When a carry is present, a high signal will be provided on line 186. The occurrence of a carry from any of Adder circuits indicates that a single bit data error or a multibit error has occurred. When the output signal on line 186 is low, it indicates that either a check bit single bit error has occurred or no error has occurred. It is apparent that many combinations of syndrome bits S0 through S5 can exist, and attention is directed to FIG. 3 where the Syndrome Map defines the syndrome bit combinations.

High AND 190 is utilized to detect multibit error and check bit single errors. High AND 190 receives the syndrome bits S6 on line 58b-6, together with the signals on line 64-0, 64-1, 64-2 and 64-3. Its output signal is provided on line 192 to the 1 input terminal of 2-1 Sel. 182 and low AND 180. In order to understand the functioning of this selection, attention is referenced back to FIG. 4 and the Syndrome Map of FIG. 3. The signal on line 64-0 is provided by the 0 output of 2-4 Decode 100, and essentially decodes the positions enclosed within dashed block 194 of FIG. 3. The signal on line 64-0 will be low when both syndrome bits S5 and S4 are low. The signal on line 104 is utilized to enable decode circuit 106 when in the low state, which occurs when syndrome bit S5 is zero and syndrome bit S4 is one. This condition provides the precondition for the selection of the area shown within dashed block 196 of FIG. 3. It can be seen, then, that when both syndrome bits S3 and S2 are zero, that a low or zero output will be provided on line 64-3. When syndrome bit S5 is one, and syndrome bit S4 is zero, there will be a low enable signal on line 108 to Decode circuit 110. This condition provides the initial selection for the areas in the Syndrome Map shown enclosed within dashed block 198, and 200. The final selection for the area of 198 will occur when syndrome bits S2 and S3 are both zero, thereby resulting in the zero signal on line 64-2. The final selection for the area shown within dashed block 200 will occur when syndrome bit S2 is one and syndrome bit S3 is zero, thereby resulting in a zero output signal on line 64-1. Now returning to a consideration of FIG. 6, it can be seen that the occurence of a low signal on any line 64-0 through 64-3 or a zero for syndrome bit S6 will result in a low signal on line 192. Such a low signal in combination with a low signal on line 184 will result in low AND circuit 180 providing a high multiple bit error MBE on line 76. Under these conditions, the 2-1 Sel. 182 would have a high signal on line 186, thereby enabling the selection of the 1 input terminal. Since high AND 90 is providing a low signal on line 192, this low signal will be passed on line 74. When high OR 168 provides a low signal on line 186 to the enable E input terminal of circuit 182, its 0 input is selected, and in this case the signal condition of syndrome bit S6 will be passed through on line 174. This would signify the condition that no errors are specified by syndrome bits S0 through S5, and if S6 is zero, would indicate a low condition on line 74 for the No Error condition. When syndrome bit S6 is one, it indicates an error in syndrome bit S6 only.

Finally, low AND 202 provides a no error NE signal on line 72 when both input signals are low. The no error NE signal high is utilized to gate the read data to the processor (not shown). The high single bit error SBE signal is utilized to enable the Error Correction Circuitry 68. (See FIG. 1.) The high multiple bit error MBE signal is utilized to signal the processor that the read data contains errors, or alternatively to inhibit the transfer of the incorrect read data.

Having described the detail logic circuits of the subject invention, it can be seen that the subject invention functions to evaluate the syndrome bits for errors by looking for single bit errors and no errors. When these conditions do not exist, it necessarily indicates the error is a multiple bit error. This is in contradistinction to the operation of the prior art which evaluates the syndrome bits by looking for multiple error and no errors, and concluding that the absence of each of these conditions indicates that the error is a single bit error. Functionally, then, the operation of the invention can be summarized. The syndrome bits S0 through S6 are generated on every read cycle by means of the Syndrome Bit Generator 56. The syndrome bits are utilized to control two functions. The first function is to utilize the syndrome bits to drive the array of 2-4 Decode circuits referenced as the Error Decoder 60 and illustrated in FIG. 4. The second function is to utilize the syndrome bits to drive the circuitry illustrated in FIG. 6 to decode the type of error that has been detected. In this regard, AND circuit 190 detects the areas 194, 196, 198 and 200 of the Syndrome Map illustrated in FIG. 3. These areas define multiple bit errors M and the check bit single errors Ci. The specific type of error is separated and indicated by AND circuit 180 and 2-1 Sel. 182. The Adder circuits 160, 162 and 164 determine if more than one syndrome bit is set. This is accomplished by adding selected groupings of syndrome bits S0 through S5, and evaluating the carries that result in OR circuit 168. OR 168 provides an activating signal on line 186 when an Adder circuit provides a carry, thereby indicating that a single bit data error or a multiple bit error has occurred. When no carry is detected, OR 168 indicates a check bit single bit error has occurred or no error has occurred. The functioning of 2-1 Sel. 182 is controlled by OR 168 such that when a high signal is provided on line 186, the 1 input terminal will be selected from AND 190. This input signal from AND 190 indicates if the error was a single bit data error because this input cannot be selected if the error is a check bit single bit error, as previously described. When OR 168 provides a low signal on line 186, the 0 input line is selected, and if syndrome bit S6 is a one, a check bit single bit error is indicated. Finally, AND 180 will provide a high output signal when OR 168 indicates that more than one syndrome bit has been set, and no data signal bit errors have been detected by AND 190. This last condition indicates that a multiple bit error has occurred.

Having described the invention and a preferred embodiment thereof that satisfies the various stated purposes and objectives of the invention, without departing from the spirit and scope of the invention, what is intended to be protected by Letters Patent is set forth in the appended claims.

What is claimed is:

1. An improved error occurrence detector for use with an error correction code system that has check bits associated with data words and includes circuitry for providing reconstituted check bits for the data words and syndrome bit generating circuitry responsive to the check bits and the reconstituted check bits for providing syndrome bits, said error occurrence detector comprising:

first circuit means responsive to selected ones of the syndrome bits for providing first signals indicative of multiple bit errors and check bit single bit errors;

adder means responsive to predetermined combinations of syndrome bits for providing second signals indicative that more than one syndrome bit is present, said adder means including a plurality of full adder circuit means each responsive at least in part to different ones of the syndrome bits, and each capable of providing sum and carry output signals;

gate circuit means responsively coupled to said adder means for providing third signals in response to said second signals indicative that single bit or multiple bit errors have occurred, and for providing fourth signals in the absence of said second signals indicative that a check bit single bit error or no error has occurred; and selector means responsively coupled to said first circuit means and said gate circuit means for providing first indicating signals indicative of a first type of detected error and for providing second indicating signals indicative of a second type of detected error in response to said first, third and fourth signals.

2. An improved error occurrence detector as in claim 1 wherein said plurality of full adder, circuit means includes first and second full adder circuits each having first and second input terminals for receiving predetermined syndrome bits, an input carry terminal, and sum and carry output terminals; and a third full adder circuit having a first input terminal coupled to said sum output terminal of said first full adder circuit and a second input terminal coupled to said sum output terminal of said second full adder circuit, said third full adder circuit having an input carry terminal for receiving a predetermined syndrome bit and having a carry output terminal.

3. An improved error occurrence detector as in claim 1 wherein said selector means includes a first selector circuit responsively coupled to said first circuit means and said gate circuit means and having an input terminal for receiving a predetermined syndrome bit and having an output terminal for providing said first type of detected error signal for detected single bit errors; and a second selector circuit responsively coupled to said first circuit means and said gate circuit means and having an output terminal for providing said second type of detected error signals for detected multiple bit errors.

4. An improved memory system having error correction code circuitry with an improved error indicating system in combination comprising:

memory means for storing data words and check bits associated with said data words;

reading means for reading data words and associated check bits from said memory means;

read data check bit generator means coupled to said reading means for generating read data check bits;

syndrome bit generator means coupled to said read data check bit generator means and said reading means for generating syndrome bits indicative of predetermined comparison relationship between said read data check bits and said check bits stored in said memory means;

error decoder means responsively coupled to said syndrome bit generator means for decoding said syndrome bits for providing error correction control signals for errors that are correctable;

error correction means responsively coupled to said reading means and said error decoder means for correcting read data bits determined to be in error; and error indicator means coupled to said syndrome bit generator means and said error decoder means for providing error indicating signals indicative of the types of errors detected, said error indicator means including adder means responsive to at least some of said syndrome bits, where said adder means includes a plurality of full adder circuit means each responsive at least in part to predetermined different ones of said syndrome bits.

5. An improved memory system as in claim 4 wherein said error indicator means includes selector circuit means responsively coupled to said adder means for providing a first signal indicative of a first type of detected error and for providing a second signal indicative of a second type of detected error.

6. An improved memory system as in claim 5 wherein said selector circuit means includes first circuit means responsive to selected ones of the syndrome bits;

gate circuit means responsively coupled to said adder means;

a first selector circuit responsively coupled to said first circuit means and said gate circuit means and having an input terminal for receiving a predetermined syndrome bit, and having an output terminal for providing said first signal indicating a detected single bit error; and a second selector circuit responsively coupled to said first circuit means and said gate circuit means and having an output terminal for providing said second signal indicating a detected multiple bit error.

7. An improved memory system as in claim 4 wherein said plurality of full adder circuit means are each responsive at least in part to different ones of the syndrome bits, and each is capable of providing sum and carry output signals, said carry output signals comprising an indication of the occurrence of more than one syndrome bit.

8. An improved memory system as in claim 4 wherein said plurality of adder circuit means includes first and second full adder circuits each having first and second input terminals for receiving predetermined syndrome bits, an input carry terminal, and sum and carry output terminals; and a third full adder circuit having a first input terminal coupled to said sum output terminal of said first full adder circuit and a second input terminal coupled to said sum output terminal of said second full adder circuit, said third full adder circuit having an input carry terminal for receiving a predetermined syndrome bit, and having a carry output terminal.

9. An improved memory system as in claim 4 wherein said error indicating circuit means further includes a selector means coupled to said plurality of full adder circuit means for providing a first output signal indicative of a first detected type of error and for providing a second output signal indicative of a second type of detected error.

10. For use in a digital memory system arranged for addressably storing data words and associated check bits utilized in a predetermined error correction code system, and having read circuitry for reading addressed data word and the associated check bits from the read data, syndrome bit generator circuitry for generating check bits from the read data, syndrome bit generator circuitry for generating syndrome bits in response to the read check bits and the check bits read from the memory, error decoder circuitry responsive to the syndrome bit for correcting errors that are correctable, the improvement of a read error detector and indicator circuit comprising:

adder means responsive to the syndrome bits for providing signals indicative of the occurrence of detected read errors, where said adder means includes a plurality of adder circuit means each responsive at least in part to different ones of the syndrome bits and each capable of providing sum and carry output signals, selected ones of said output signals indicative of the occurrence of more than one syndrome bit; and selector means responsive at least in part to said adder means for providing a first signal indicative of a first type of detected read error and for providing a second signal indicative of a second type of detected read error.

11. A read error detector and indicator circuit as in claim 10 wherein said plurality of adder circuit means includes first and second full adder circuits each having first and second input terminals for receiving predetermined syndrome bits, an input carry terminal, and sum and carry output terminals; and a third full adder circuit having a first input terminal coupled to said sum output terminal of said first full adder circuit and a second input terminal coupled to said sum output terminal of said second full adder circuit, said third full adder circuit having an input carry terminal for receiving a predetermined syndrome bit, and having a carry output terminal.

12. A read error detector and indicator circuit as in claim 10 wherein said selector means includes first circuit means responsive to selected ones of the syndrome bits for providing first control signals indicative of first predetermined errors;

gate circuit means responsively coupled to said adder means for providing second control signals in response to said carry signals indicative that second predetermined errors have occurred and for providing third control signals in the absence of said carry signals indicative that third predetermined errors or no error have occurred;

a first selector circuit responsively coupled to said first circuit means and said gate circuit means and having an input terminal for receiving a predetermined syndrome bit and having an output terminal for providing said first signal indicative of a first type of detected read error comprising a detected single bit error; and a second selector circuit responsively coupled to said first circuit means and said gate circuit means and having an output terminal for providing said second signal indicative of a second type of a detected read error comprising detected multiple bit errors.

13. A read error detector and indicator circuit as in claim 12 and further including:

no-error detector means coupled to said first selector circuit and said second selector circuit for providing signals indicative of no detected read error in response to the absence of said first signal indicative of a first type of detected read error and the absence of said second signal indicative of a second type of detected read error.

* * * * *